(12) United States Patent
Davis et al.

(10) Patent No.: US 11,862,691 B2
(45) Date of Patent: Jan. 2, 2024

(54) FIELD EFFECT TRANSISTOR HAVING FIELD PLATE

(71) Applicant: Raytheon Company, Waltham, MA (US)

(72) Inventors: Michael S. Davis, Ipswich, MA (US); Eduardo M. Chumbes, Andover, MA (US); Brian T. Appleton, Jr., Stoneham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/671,438

(22) Filed: Nov. 1, 2019

(65) Prior Publication Data

US 2021/0134965 A1    May 6, 2021

(51) Int. Cl.
*H01L 29/40* (2006.01)

(52) U.S. Cl.
CPC .......... *H01L 29/402* (2013.01); *H01L 29/401* (2013.01); *H01L 29/408* (2013.01)

(58) Field of Classification Search
CPC ............. H01L 21/02321; H01L 29/402; H01L 29/408
See application file for complete search history.

(56) References Cited

U.S. PATENT DOCUMENTS

| | | | |
|---|---|---|---|
| 6,472,722 B1 * | 10/2002 | Ho | ...................... H01L 29/404 257/314 |
| 8,120,064 B2 | 2/2012 | Parikh et al. | |
| 8,530,978 B1 | 9/2013 | Chu et al. | |
| 9,449,826 B2 | 9/2016 | Mulfinger et al. | |
| 9,653,556 B1 | 5/2017 | Yang | |
| 2005/0274985 A1 | 12/2005 | Adlerstein | |
| 2006/0006415 A1 | 1/2006 | Wu et al. | |
| 2008/0073670 A1 * | 3/2008 | Yang | ..................... H01L 29/404 257/E29.253 |
| 2010/0193866 A1 | 8/2010 | Mulfinger et al. | |
| 2010/0264486 A1 | 10/2010 | Denison et al. | |
| 2011/0221011 A1 * | 9/2011 | Bahat-Treidel | ....... H01L 29/404 257/E21.54 |
| 2012/0070970 A1 | 3/2012 | Tomita | |
| 2014/0264360 A1 | 9/2014 | Huang et al. | |

(Continued)

OTHER PUBLICATIONS

Taiwanese Office Action with English Translation dated Jun. 10, 2021 for Taiwan Application No. 109131130; 17 Pages.

(Continued)

*Primary Examiner* — Eric K Ashbahian
(74) *Attorney, Agent, or Firm* — DALY, CROWLEY, MOFFORD & DURKEE, LLP

(57) ABSTRACT

A field effect transistor having a field plate structure for shaping an electric field in a region between the gate and the drain, such field plate structure having: a dielectric layer disposed on gate and on the surface of the semiconductor in the region between gate and the drain; and electric charge disposed in portions of the dielectric layer, a portion of such charge being disposed in the dielectric layer over an upper surface of the gate and another portion of the change extending from the upper surface of the gate into the region between gate and the drain; and wherein the electric charge solely produces the electric field.

7 Claims, 7 Drawing Sheets

(56) References Cited

U.S. PATENT DOCUMENTS

| | | | | |
|---|---|---|---|---|
| 2014/0346615 A1* | 11/2014 | Zhang | .................... | H01L 29/78 257/411 |
| 2015/0115326 A1* | 4/2015 | Prechtl | ................ | H01L 29/7786 257/471 |
| 2015/0144953 A1* | 5/2015 | Hill | ....................... | H01L 29/402 257/76 |
| 2018/0175186 A1* | 6/2018 | Chen | ................... | H01L 29/0688 |
| 2020/0219986 A1* | 7/2020 | Then | .................... | H01L 29/408 |

OTHER PUBLICATIONS

Notification of Transmittal of the International Search Report and the Written Opinion of the ISA dated Nov. 18, 2020 for International Application No. PCT/US2020/048323; 1 Page.
International Search Report dated Nov. 18, 2020 for International Application No. PCT/US2020/048323; 5 Pages.
Written Opinion of the ISA dated Nov. 18, 2020 for International Application No. PCT/US2020/048323; 10 Pages.
Response (with English Translation) to Taiwan Office Action dated Jun. 10, 2021 for Taiwan Application No. 109131130; Response filed Sep. 3, 2021; 43 Pages.
Taiwan Allowance Decision (with English Translation) dated Feb. 15, 2022 for Taiwan Application No. 109131130; 3 Pages.
PCT International Preliminary Report on Patentability dated May 12, 2022 for International Application No. PCT/US2020/048323; 10 Pages.

* cited by examiner

FIELD EFFECT TRANSISTOR HAVING FIELD PLATE

TECHNICAL FIELD

This disclosure relates generally to field effect transistors and more particularly to field effect transistors having field plate structures.

BACKGROUND OF THE INVENTION

As is known in the art, GaN-based Field Effect Transistor (FET) devices are capable of operating at much higher voltages than previous-generation devices based on GaAs or Si. Consequently, RF GaN devices can achieve much higher output powers with comparable power-added efficiencies. However, GaN-based devices still exhibit some challenges when operated at high voltages. During the off-state portion of the RF cycle (where the drain-to-gate voltage reaches a maximum), the electric field maximum located at the drain edge of the gate reaches an extreme level that is typically on the same order as the breakdown field strength of GaN (~3 MV/cm). This peak field has several negative consequences. First, carrier injection through the gate is greatly enhanced by the large electric field resulting in excessive leakage, which in turn can contribute to either pre-mature device breakdown and/or catastrophic device failure. Second, field-enhanced trapping by surface states or traps in the buffer can lead to substantial DC/RF dispersion. DC/RF dispersion is characterized by the combination of "current collapse" (reduction of maximum current density under RF operation compared to its DC counterpart) and "knee walkout" (increased on-resistance of the transistor under RF operation compared to its DC counterpart). These deleterious electric field-induced effects counteract efforts to further improve output power or high-frequency performance by scaling the transistor laterally (smaller source-drain spacing) or by increasing its operating voltage.

Surface passivation with a dielectric, typically silicon nitride, has helped mitigate DC/RF dispersion at low-to-moderate voltage operation (typically <25 V, depending on device geometry). However, difficulties are still encountered with device breakdown and DC/RF dispersion at higher voltages. Field plates have been developed in GaN devices to shape the electric field and reduce its peak value. Field plate structures made of thin film metals connected to the gate (gate connected field plate) or the source (source connected field plate) have helped not only to reduce DC/RF dispersion but also to reduce leakage and increase breakdown voltage. These performance improvements are possible because the field plate geometries are designed to better distribute the voltage drop between the gate and the drain and therefore reduce the peak electric field in the device. Minimizing the peak field in the device reduces leakage, reduces DC/RF dispersion, and enhances breakdown voltage. For these reasons, field plate features have been essential in designing RF GaN devices that operate at higher voltages and offer exceptional output powers and efficiencies.

However, conventional thin-film metal field plates have introduced a host of fabrication difficulties that include defect generation (from photolithography, metal deposition, and metal lift-off processes), poor metal step coverage of the field plate itself, poor dimensional control as a result of metal lift-off processes, and added topography that can impact subsequent processing. Aside from the fabrication difficulties, conventional field plates also increase parasitic gate and drain capacitances which in turn limit transistor gain and maximum operating frequency.

SUMMARY OF THE INVENTION

In accordance with the present disclosure, a field effect transistor structure is provided comprising a field plate structure for shaping an electric field in a region between the gate and the drain, such field plate structure comprising: a dielectric layer disposed on gate and on the surface of the semiconductor in the region between gate and the drain; and electric charge disposed in portions of the dielectric layer, such electric charge solely producing the electric field.

In one embodiment, a field effect transistor structure is provided comprising a field plate structure for shaping an electric field in a region between the gate and the drain, such field plate structure comprising: a dielectric layer disposed on gate and on the surface of the semiconductor in the region between gate and the drain; and ion implanted electric charge disposed in portions of the dielectric layer.

In one embodiment, a field effect transistor structure is provided comprising: a semiconductor having a source, a drain and a gate in contact with corresponding portions of a surface of the semiconductor, a field plate structure for shaping an electric field in a region between the gate and the drain, such field plate structure comprising: a dielectric layer on the surface of the semiconductor over the region between the gate and the drain; and fixed, immobile electric charge, having a predetermined distribution, disposed in the dielectric layer over the region between the gate and the drain.

In one embodiment, the fixed, immobile electric charge solely enables the field plate structure to shape the electric field in the region between the gate and the drain.

In one embodiment, the charge is electrically isolated from the source and drain.

In one embodiment, a method is provided for forming a field effect transistor, comprising: providing a semiconductor structure having a source, a drain and a gate in contact with corresponding portions of a surface of the semiconductor structure; forming a field plate, comprising: providing a dielectric layer disposed on the surface of the semiconductor in regions between the source and the drain, such dielectric layer extending over the gate; and depositing electric charge disposed in portions of the dielectric layer from a source external of the semiconductor structure, a portion of such charge being disposed in the dielectric layer over an upper surface of the semiconductor structure, the charge extending over the region between the gate and the drain.

In one embodiment, the charge is deposited with a predetermined distribution into the dielectric layer.

In one embodiment, a field effect transistor is provided, comprising: a semiconductor having a source, a drain and a gate in contact with corresponding portions of a surface of the semiconductor, a field plate comprising: a dielectric layer disposed on the surface of the semiconductor in a region between the source and the drain, the electric charge being disposed in a predetermined distribution in portions of the dielectric layer.

In one embodiment, a field effect transistor is provided, comprising: a semiconductor; a source, a drain and a gate in contact with corresponding portions of a surface of the semiconductor, a plurality of vertically stacked dielectric layers, an upper one of the vertically stacked dielectric layers having fixed, immobile electric charge disposed in portions thereof providing a field plate structure, the fixed, immobile charge solely providing the field plate structure shaping an electric field in a region between the gate and the drain of the transistor, and wherein in the charge solely modifies the electric field in the region between the gate and drain of the transistor.

In one embodiment, a method is provided for forming a field effect transistor, comprising: providing a semiconductor structure having a source, a drain and a gate in contact with a corresponding portions of a surface of the semiconductor; providing a dielectric layer disposed on the surface of the semiconductor over a region between the gate and the drain; and depositing electric ions disposed in portions of the dielectric layer from a source external of the semiconductor structure into the dielectric layer between the gate and the drain.

In one embodiment, a second dielectric with more suitable material properties may be selectively or non-selectively disposed on the above structure. This second dielectric would extend over the gate; and fixed, immobile electric charge disposed in portions of the dielectric layer, a portion of such charge being disposed in the dielectric layer over an upper surface of the gate and another portion of the charge being disposed in the dielectric layer in the region extending from the upper surface of the gate to a location between the gate and the drain.

With such an arrangement, the charge in the dielectric layer effectively substitutes for a conventional thin-film metal field plate. The charged dielectric region acts as a self-biased field plate that can produce an electric field to modify the electric field distribution in the transistor and reduce the value of the maximum electric field. This style of field plate eliminates the fabrication and yield difficulties associated with conventional thin-film metal field plates. Introducing charge in the dielectric as described in these embodiments is done via ion implantation. This process involves accelerating ions from a source through an electric field directed into the sample, in this case our dielectric, changing its physical, chemical and/or electric properties. It is a process that is commonly used in semiconductor device fabrication. The ion implant dose and distribution can be adjusted to suit breakdown requirements and to achieve the desired electric field shaping. The ion implant species and implant technique can be selected to suit breakdown requirements and polarity. The ion implant provides very simplified processing to achieve similar field reduction.

The ion implant pattern, in another embodiment, can be created such that its aerial image will grade the dose implanted into the dielectric in such a way to effectively tilt or slant the field plate to achieve the desired electric field profile.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

FIG. 4B' is a cross-sectional, diagrammatical sketch of a Field Effect Transistor having a field plate structure according to an alternative embodiment of the disclosure;

Like reference symbols in the various drawings indicate like elements.

DETAILED DESCRIPTION

Figure 1A:
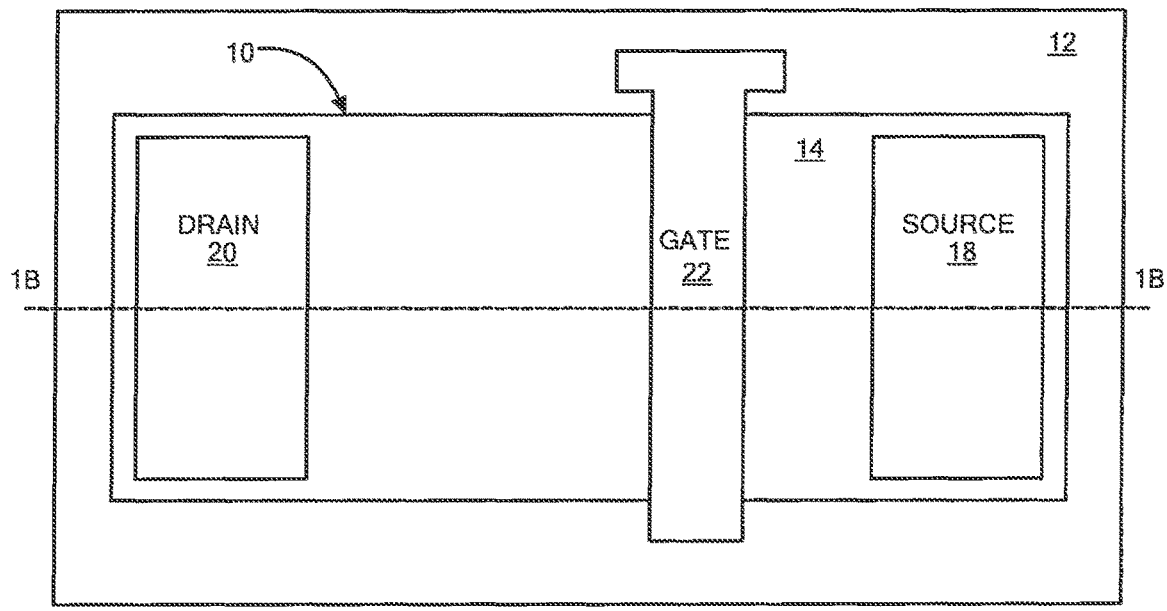
FIGS. 1A-1B through 4A-4B are plan and cross-sectional, diagrammatical sketches of a Field Effect Transistor having a field plate structure according to the disclosure at various stages in the fabrication thereof, the cross-sections being taken along lines 1B-1B through 4B-4B, respectively.
Figure 1B:
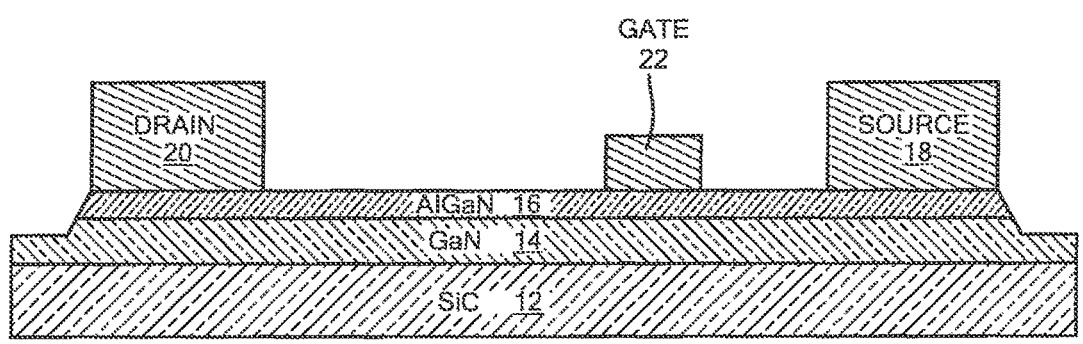

Referring now to FIGS. 1A and 1B, a mesa structure 10 is shown having a substrate 12, here for example, a semiconductor substrate such as gallium arsenide (GaAs), gallium nitride (GaN), silicon (Si), gallium oxide ($Ga_2O_3$), or silicon carbide (SiC); a gallium nitride (GaN) buffer layer 14 on the substrate 12 and an aluminum gallium nitride (AlGaN) layer 16 on, and forming a heterojunction with, the GaN layer 14. A source electrode 18 and a drain electrode 20 are in ohmic contact with the AlGaN layer 16 and a gate electrode 22, disposed between the source electrode 18 and drain electrode 20 is here in Schottky contact with the AlGaN layer 16, the gate electrode being used for controlling a flow of carriers between the source electrode 18 and the drain electrode 20 through a two-dimensional electron gas (2DEG) channel formed by the heterojunction.

Figure 2A:
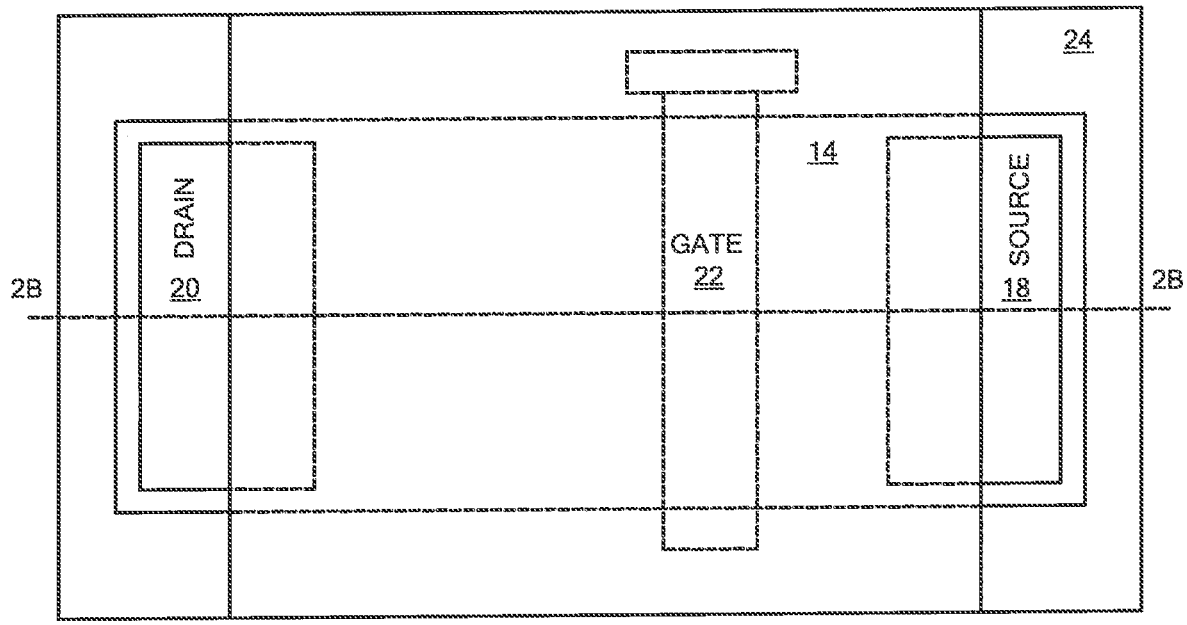
Figure 2B:
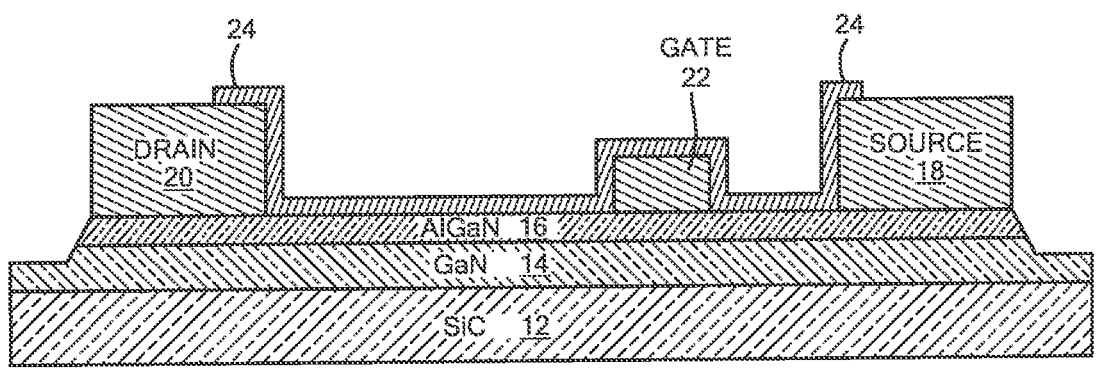

Referring now to FIGS. 2A and 2B, a layer of dielectric material, here silicon nitride ($SiN_x$), $SiO_2$, $Al_2O_3$, or $Ta_2O_5$, for example, is formed over the surface of the structure by plasma enhanced chemical vapor deposition (PECVD), Low Pressure Chemical Vapor Deposition, for example, and patterned using conventional photolithography and etching processes to form a dielectric layer 24 over the surface as shown in FIG. 2B. The layer 24 extends from a portion of the drain electrode 20, over the surface of the AlGaN layer 16 between the drain electrode 20 and the gate electrode 22, over the top and sides of the gate electrode 22 and then over the surface of the AlGaN layer 16 between the gate electrode 22 and the source electrode 18 and then over a portion of the source electrode 18 as shown. It should be noted that if the dielectric layer 24 is not of sufficient quality, a second dielectric layer 24', can be deposited over the layer 24 for this purpose as will be described below in connection with FIG. 4B'.

Figure 3A:
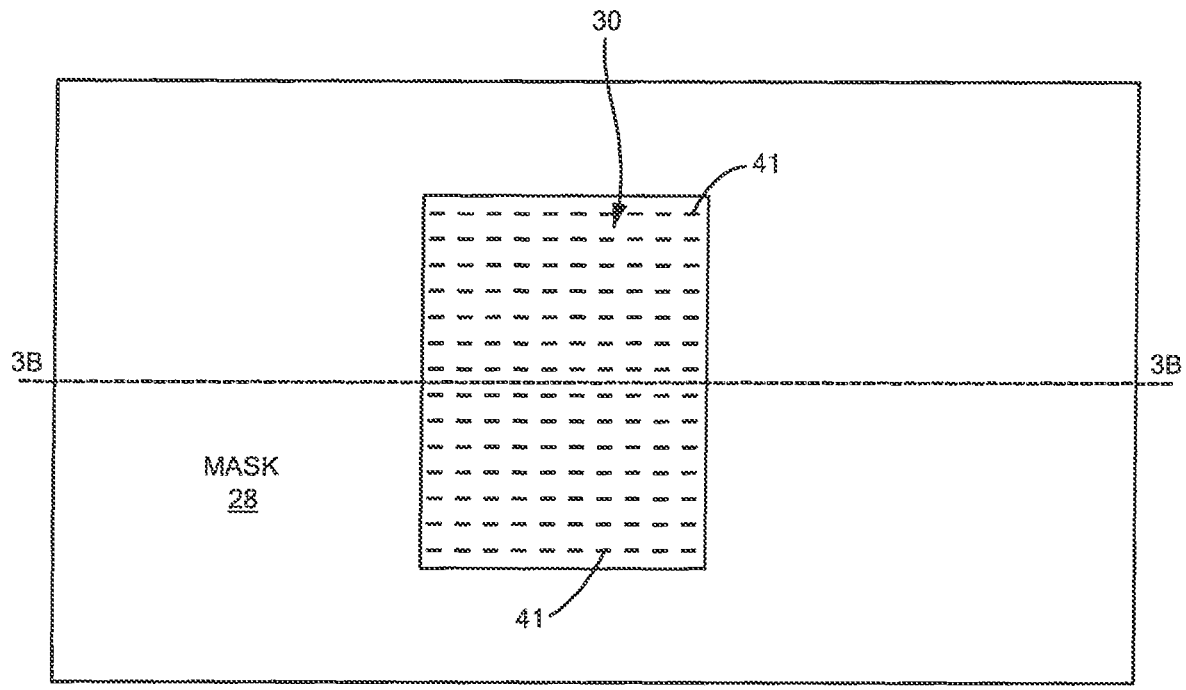
Figure 3B:
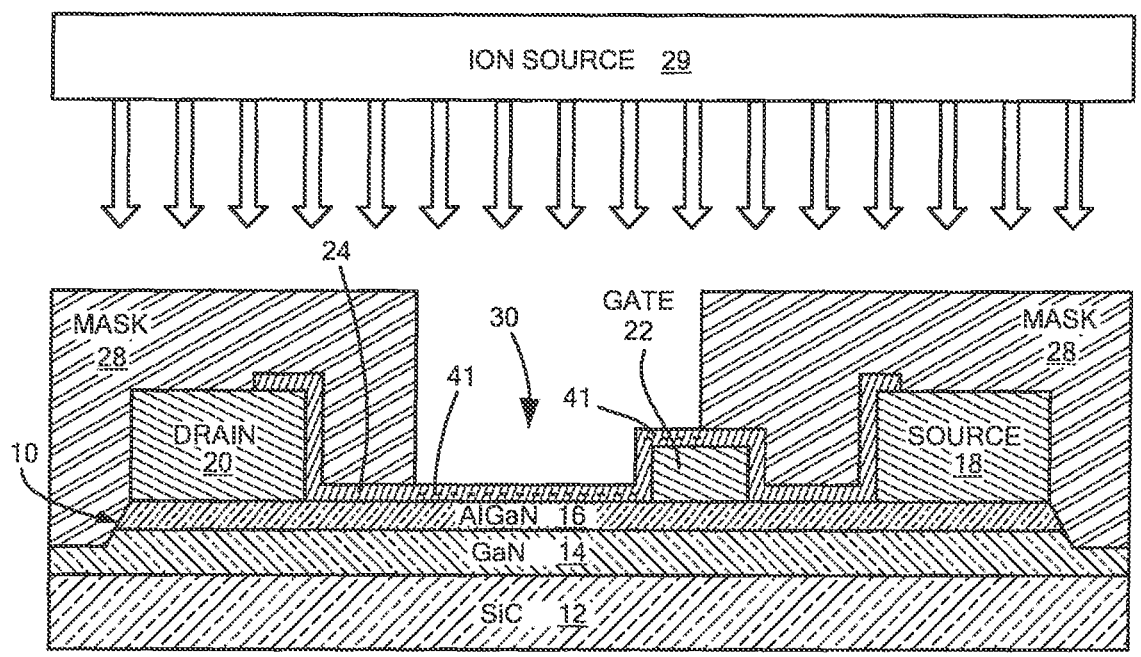

Continuing with FIGS. 3A and 3B, a mask 28 having a window 30 therein is disposed over the upper surface of the structures as shown. Ions 41, (here negative charge indicated by the symbol (−) from a source 29 external to the semiconductor structure 10, here the source 29 is an ion implanter, are implanted via ion implantation into the portions of the dielectric layer 24 exposed by the window 30. Here, the distribution is uniform along the direction parallel to the surface of dielectric layer 24 and has a predetermined distribution in the depth of dielectric layer 24; here, for example, a Gaussian distribution having a peak at a predetermined depth into upper surface of dielectric layer 24. More particularly, ions are deposited into the region between drain and gate utilizing ion implantation of proper species (heavy ion to reduce diffusion in subsequent processing steps), charge (negative for n-channel transistors and positive for p-channel transistors, energy (low energy to create shallow layer in dielectric layer 24), and dose (sufficient dose to create the correct electrical potential of the self-biased field plate). This charge (ions) is deposited utilizing mask 28, here a photolithographically defined mask, to restrict the region of implantation to the region between drain 20 and gate 22 without extending into the region between gate 22 and source 18 so as to eliminate any possible increase of the parasitic gate to source capacitance.

The window 30 need not be merely a simple open window to deposit the charge uniformly into layer 24, but may be modified to tailor the charge (ion) distribution and resultant semiconductor field such as a stipple of dots 30' or stripes 30" as shown for masks 28' and 28" in FIGS. 6A and 6B and FIGS. 7A and 7B, respectively to create a diffraction-like grating pattern to tailor the charge distribution and resultant semiconductor field. For example, the apertures 30' and 30" may be arranged in size and spacing to provide a graded charge distribution. Thus, the charge 41 is deposited non-uniformly into the dielectric layer 24. Thus, the masks 28' or 28" provide a predetermined, non-uniform, distribution of ions along the surface of the dielectric layers 24 or 24'.

The correct ions to implant should be relatively large (slow thermal diffusion), such as negative ions $Sr^-$, $Ba^-$, $Ra^-$, and $Ca^-$, or positive ion of $Cs^+$, and also be electrically stable to modify the semiconductor field over the expected device lifetime. The correct energy would be somewhat low to create a shallow, well defined sheet charge; for example, in a range of 10-40 keV. The correct dose would be determined through simulations and experiments and would depend on the masking method (rectangular or stippled); however, that dose would be on the order of 1e13 ions/cm$^2$ to 1e15 ions/cm$^2$.

Figure 4A:
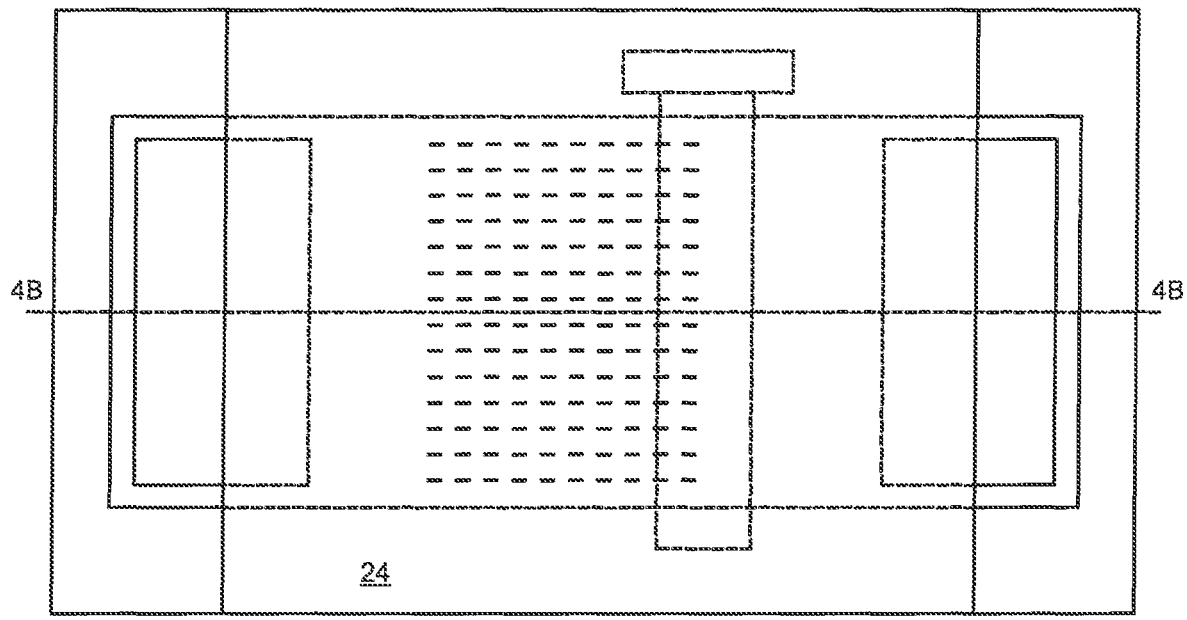
Figure 4B:
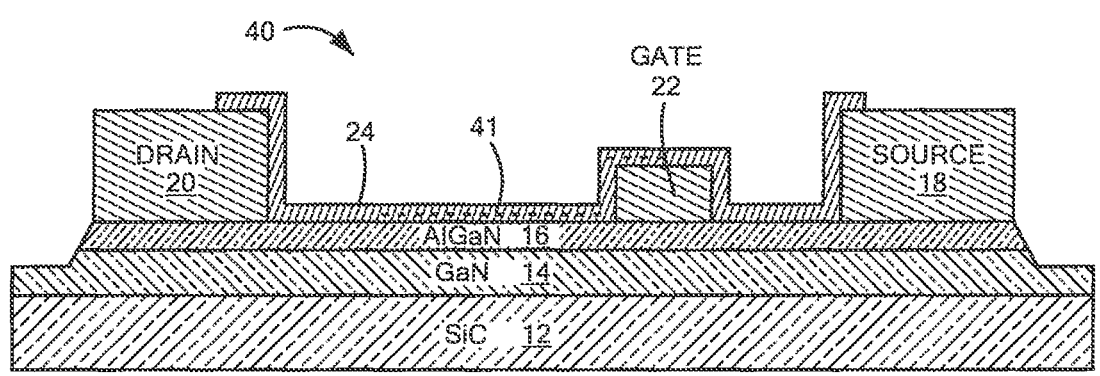
Figure 4B:
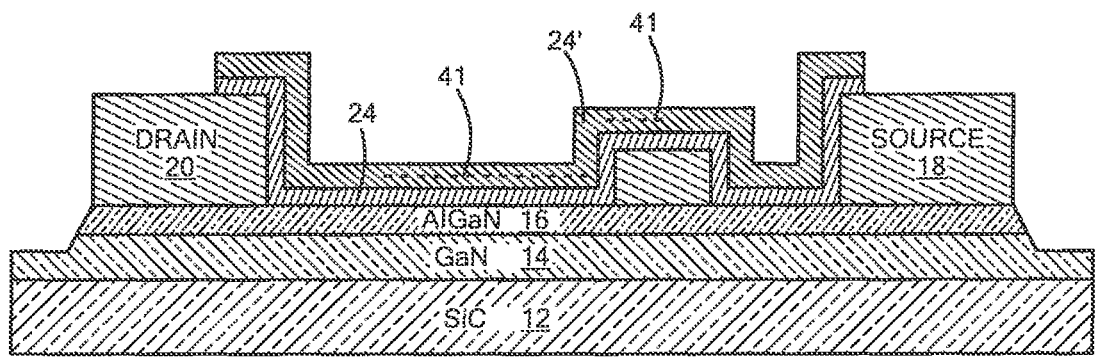

Referring to FIGS. 4A and 4B, once the ions 41 are in place and the photolithographically defined mask 30 is removed, semiconductor processing is completed with the ion charge un-annealed and remaining in place to distribute the electric field in the gate to drain region. It should be noted that the electric field produced by the field plate structure 41 is provided solely by the electric ions 41 in the dielectric layer 24. It should also be noted that the process described above with regard to the ion implantation is not semiconductor doping, but rather charge implantation with the resulting implanted charge 41 creating an implanted dielectric field plate. When operating bias is applied to the resulting semiconductor device, the peak electric field at the drain side of the gate electrode is smaller than it would be if the device had been fabricated without the implanted ions. In this regard, the device is now capable of operating at higher voltages without its peak electric field exceeding an excessive or critical value.

Figure 5:
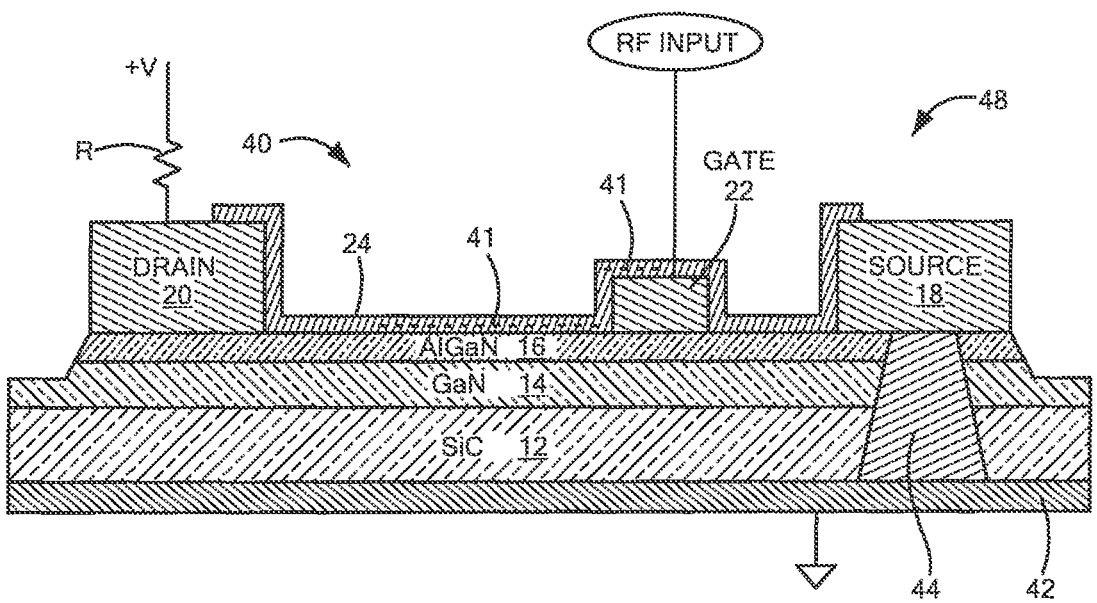
FIG. 5 is a cross-sectional, diagrammatical sketch of the Field Effect Transistor having a field plate structure according to the disclosure fabricated in accordance with FIGS. 1A-1B through 4A-4B and configured as a common source amplifier.
Figure 6A:
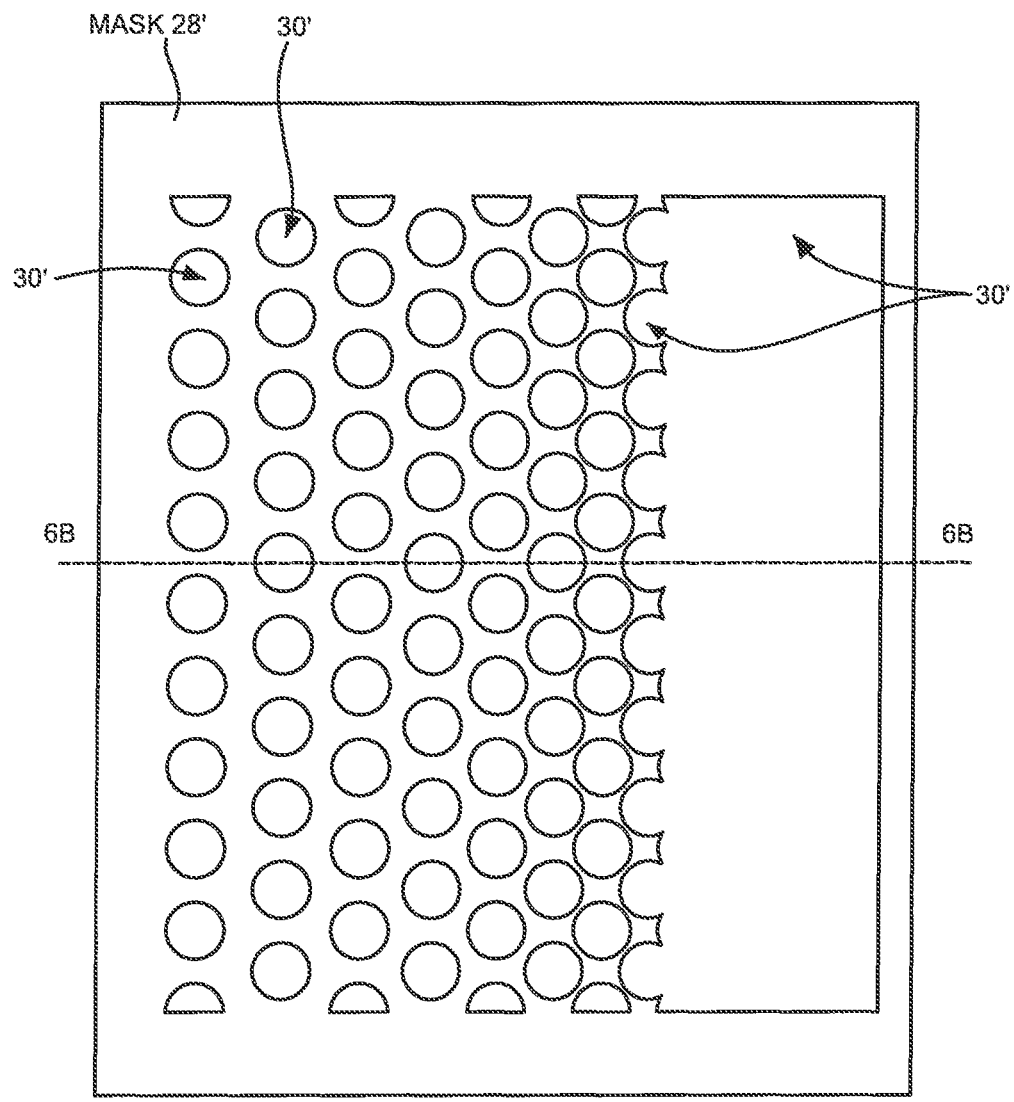
FIG. 6A is a plan view of an alternative embodiment of an ion implantation mask adapted for use in the fabrication of the Field Effect Transistor shown in FIGS. 4A and 4B.
Figure 6B:
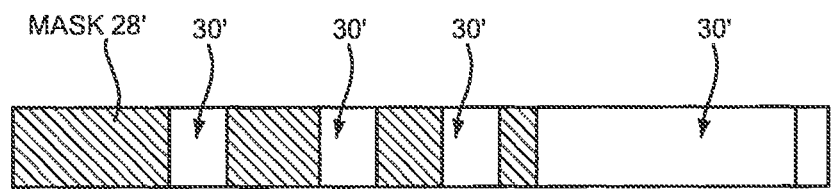
FIG. 6B is a cross sectional view of the ion implantation mask of FIG. 6A, such cross section being taken along line 6B-6B in FIG. 6A.
Figure 7A:
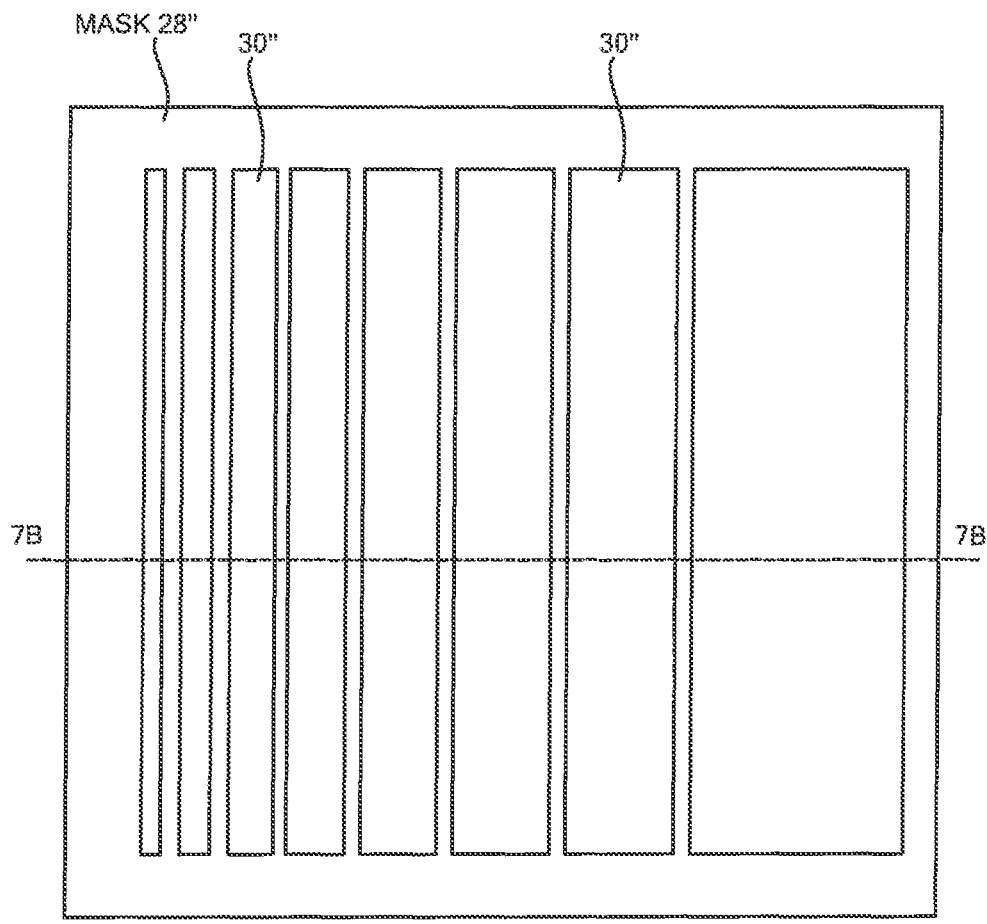
FIG. 7A is a plan view of an alternative embodiment of an ion implantation mask adapted for use in the fabrication of the Field Effect Transistor shown in FIGS. 4A and 4B.
Figure 7B:
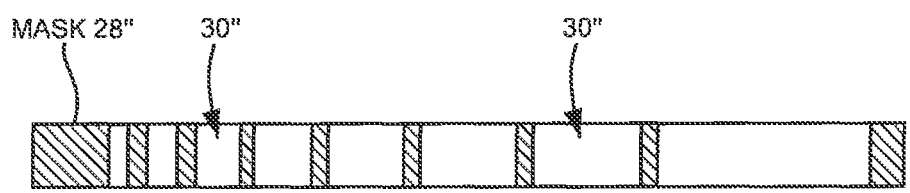
FIG. 7B is a cross sectional view of the ion implantation mask of FIG. 7A, such cross section being taken along line 7B-7B in FIG. 7A.

Referring now to FIG. 5, the Field Effect Transistor 40 structure shown in FIGS. 4A and 4B has a ground plane conductor 42 formed on the bottom of the substrate 12. The source electrode 18 is connected to a ground plane conductor 42 through a conductive via 44. The drain electrode 20 is connected to a positive voltage source +V through a resistor R and gate electrode 22 is connected to an RF input signal, as shown, to form a common source amplifier 48. It is noted that here, the ion-implanted region extends over a portion of the gate electrode 22 towards the drain electrode 20; it being noted that the ion-implanted region does not extend all the way to the drain electrode 20. It is noted that there is no annealing performed to neutralize the charge of the ions in the dielectric so that they remain charged in a floating configuration in the dielectric. It is noted that the ion implanted region is localized only in a region between the gate and drain in this common source transistor example, to eliminate source electrode side capacitance increase.

EXAMPLES

Single Dielectric Structure FIG. 4B:
    Dielectric layer 24 thickness: 60 to 150 nm
    Charge is implanted with a Gaussian-like distribution to a maximum depth: 30 to 50 nm in layer 24
    The implanted charge peak depth: 5 to 20 nm into the upper surface of layer 24
Double Dielectric Structure FIG. 4B':
    Dielectric layer 24' thickness: 45 to 150 nm
    Dielectric layer 24 would be thinner than layer 24' in the double dielectric configuration for device reasons other than the implanted field plate, such as device passivation
    Charge is implanted with a Gaussian-like distribution layer to a maximum depth: 30 to 50 nm in layer 24'
    The implanted charge peak depth: 5 to 20 nm into the upper surface of layer 24'

A number of embodiments of the disclosure have been described. Nevertheless, it will be understood that various modifications may be made without departing from the spirit and scope of the disclosure. Accordingly, other embodiments are within the scope of the following claims.

What is claimed is:
1. A method, comprising:
   forming a field effect transistor, the forming comprising:
   providing a semiconductor structure having a source electrode, a drain electrode, and a gate electrode in contact with corresponding portions of a surface of the semiconductor structure, wherein the gate electrode has a top surface;
   forming a field plate, wherein the field plate is metal free, forming the field plate comprising:
      providing a dielectric layer disposed on the surface of the semiconductor structure in regions between the source electrode and the drain electrode, the dielectric layer extending over the top surface of the gate electrode;
      providing a mask on the dielectric layer, the mask covering areas of the dielectric layer and exposing portions of the dielectric layer, wherein the mask has apertures including a stipple of dots;
      implanting electric ions in the portions of the dielectric layer exposed by the mask from a source external of the semiconductor structure, the electric ions extending over a region between the top surface of the gate electrode and the drain electrode, the electric ions implanted in the portion of the dielectric layer extending from the top surface of the gate electrode toward the drain electrode so that the electric ions are at least over the top surface of the gate electrode,
   wherein no electric ions are implanted in a portion of the dielectric layer extending from the drain electrode toward the gate electrode covered by the mask,
   wherein providing the dielectric layer comprises providing the dielectric layer directly on a top surface of the drain electrode and directly on a top surface of a source electrode, and
   wherein the electric ions are implanted into the dielectric layer in a nonuniform distribution along a direction parallel to a surface of the dielectric layer.

2. The method recited in claim 1 wherein the electric ions are deposited with a predetermined distribution into the dielectric layer.

3. The method of claim 1,
wherein the dielectric layer extends from the top surface of the drain electrode over the top surface of the gate electrode to the top surface of the source electrode.

4. A method, comprising:
forming a field effect transistor, the forming comprising:
providing a semiconductor structure having a source electrode, a drain electrode, and a gate electrode in contact with corresponding portions of a surface of the semiconductor structure, wherein the gate electrode has a top surface;
providing a field plate structure comprising a dielectric layer disposed on the surface of the semiconductor structure in a region between the gate electrode and the drain electrode and disposed on the top surface of the gate electrode, wherein the field plate structure is metal free; and
providing a mask on the dielectric layer, the mask covering areas of the dielectric layer and exposing portions of the dielectric layer, wherein the mask has apertures including a stipple of dots; and
implanting electric ions in the portions of the dielectric layer exposed by the mask between the top surface of the gate electrode and the drain electrode, the electric ions disposed in a portion of the dielectric layer extending from the top surface of the gate electrode toward the drain electrode so that some of the electric ions are at least over the top surface of the gate electrode,
wherein no electric ions are implanted in a portion of the dielectric layer extending from the drain electrode toward the gate electrode covered by the mask,
wherein providing the field plate structure comprising the dielectric layer comprises providing a dielectric layer directly on a top surface of the drain electrode and directly on a top surface of a source electrode, and
wherein the electric ions are implanted into the dielectric layer in a nonuniform distribution along a surface of the dielectric layer.

5. The field effect transistor recited in claim 4 wherein the electric ions are electrically isolated from the source electrode and drain electrode.

6. The field effect transistor recited in claim 4 wherein the electric ions have a predetermined distribution in the dielectric layer.

7. The method of claim 4,
wherein the dielectric layer extends from the top surface of the drain electrode over the top surface of the gate electrode to the top surface of the source electrode.

* * * * *